(12) United States Patent
Han et al.

(10) Patent No.: US 8,279,302 B2
(45) Date of Patent: *Oct. 2, 2012

(54) METHOD FOR INTEGRATING IMAGE SENSOR

(75) Inventors: Hyung-Jun Han, Chungcheongbuk-do (KR); Moo-Sup Lim, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 588 days.

This patent is subject to a terminal disclaimer.

(21) Appl. No.: 12/419,247

(22) Filed: Apr. 6, 2009

(65) Prior Publication Data

US 2009/0195671 A1  Aug. 6, 2009

Related U.S. Application Data

(63) Continuation of application No. 11/084,388, filed on Mar. 17, 2005, now Pat. No. 7,515,179.

(30) Foreign Application Priority Data

Apr. 27, 2004 (KR) .............................. 2004-029015

(51) Int. Cl.
*H04N 9/73* (2006.01)

(52) U.S. Cl. ................ 348/226.1; 348/222.1; 348/227.1

(58) Field of Classification Search ................ 348/226.1
See application file for complete search history.

(56) References Cited

U.S. PATENT DOCUMENTS

| | | | |
|---|---|---|---|
| 6,084,632 A | 7/2000 | Inuiya et al. ................ 348/227.1 |
| 6,995,801 B1 | 2/2006 | Nakakuki et al. ............. 348/364 |
| 7,142,234 B2 * | 11/2006 | Kaplinsky et al. ......... 348/226.1 |
| 7,187,405 B2 * | 3/2007 | Poplin et al. ............... 348/226.1 |
| 7,209,169 B2 * | 4/2007 | Matsumoto et al. .......... 348/302 |
| 7,312,823 B1 * | 12/2007 | Mori ............................ 348/269 |
| 7,397,503 B2 * | 7/2008 | Baer et al. ................... 348/226.1 |
| 7,471,315 B2 * | 12/2008 | Silsby et al. ............... 348/226.1 |
| 2004/0080630 A1 * | 4/2004 | Kim ............................ 348/226.1 |
| 2004/0179114 A1 | 9/2004 | Silsby et al. ............... 348/226.1 |
| 2006/0125931 A1 | 6/2006 | Jacumet ..................... 348/222.1 |

* cited by examiner

*Primary Examiner* — Jason Chan
*Assistant Examiner* — Pritham Prabhakher
(74) *Attorney, Agent, or Firm* — McAndrews, Held & Malloy, Ltd.

(57) ABSTRACT

Disclosed is a method for integrating an image sensor capable of removing a flicker noise without causing any burdens on a hardware due to setting up additional logics. The method for integrating an exposure time of an image sensor employing a line scan method, including the steps of: performing an integration to a first line when an integer multiple of a light source frequency is different from an integration time; and performing an integration to a second line at a phase substantially equal to a phase in which the integration to the first line is started.

8 Claims, 3 Drawing Sheets

METHOD FOR INTEGRATING IMAGE SENSOR

The present patent application is a Continuation of application Ser. No. 11/084,388, filed Mar. 17, 2005 now U.S. Pat. No. 7,515,179.

FIELD OF THE INVENTION

The present invention relates to an image sensor; and more particularly, to a method for integrating an image sensor capable of removing a flicker noise.

DESCRIPTION OF RELATED ARTS

An image sensor is a device generating an image by using a characteristic that a semiconductor device reacts to a light. That is, the image sensor is a device that reads an electric value by sensing a brightness and a wavelength of each different light coming from a subject. The image sensor serves a role in changing the electric value into a level capable of a signal process.

That is, an image sensor is a semiconductor device that converts an optical image into electrical signals. In the image sensors, a charge coupled device (CCD) is the semiconductor device that each of metal-oxide-silicon (MOS) capacitors are placed in close proximity and charge carriers are stored in or transferred between capacitors. CMOS image sensors are devices adopting a switching method for detecting output sequentially by making and using as many MOS transistors as the number of pixels based on CMOS technology that uses peripheral circuits such as control circuits and signal processing circuits. The CMOS image sensor has a great advantage of consuming a low voltage, thereby being very useful to a personal portable system such as a cellular phone.

Applicable fields of the image sensor are various, including a still-camera, a personal computer (PC) camera and terminals for a medicine, a toy and carrying. Meanwhile, if a light source is different, a flicker noise appears. However, most cases applied to the applicable fields of the image sensor requires to be used regardless of the light source and thus, it is necessary to have a capability for automatically removing the flicker noise.

The CMOS image sensor is supposed to obtain an image by controlling a time that the image sensor is exposed to a light, i.e., an integration time. If this exposed time has the integration time with an integer multiple compared with a frequency of the light source, then there is no problem. However, if this exposed time has a different integration time compared from the frequency of the light source, an amount of the light received by each line becomes different in case of the CMOS image sensor taking a data according to each line. Accordingly, a final image seems to have stripes on the image, thereby being called the flicker noise.

FIG. 1 is a graph briefly illustrating a light energy distribution according to a time when an integration time accords with a frequency of a light source.

Referring to FIG. 1, the light source having the frequency of approximately 60 Hz is used and at this time, an energy distribution period of the light source is approximately $1/120$ seconds. If the integration time is identical with the energy distribution period of the light source, i.e. approximately $1/120$ seconds, the light energy of a section A where integration to a first line is performed at a point where a phase of the light source is approximately 0 appears identically with the light energy of a section B where integration to a first line is performed at a point where a phase of the light sources is maximum during integration, i.e., scanning, of the image sensor using a line scanning way. Accordingly, the flicker noise is not generated.

FIG. 2 is a graph briefly illustrating a light energy distribution according to a time when an integration time does not accord with a frequency of a light source.

Referring to FIG. 2, the light source of approximately 60 Hz is used and at this time, the energy distribution period of the light source is approximately $1/120$ seconds. If the integration time is approximately $1/100$ seconds which is different from the energy distribution period of the light source, i.e. approximately $1/120$ seconds, the light energy of a section C where integration to the first line is performed at a point where the phase of the light source is approximately 0 appears differently from the light energy of a section D where integration to the first line is performed at the point where the phase of the light sources is maximum during integration, i.e., scanning, of the image sensor using the line scanning way. Accordingly, the flicker noise is generated.

Most CMOS image sensor controls the integration time in case of using only one frequency, thereby solving a problem generating the flicker noise. However, Japan and some countries of Europe use a frequency of approximately 50 Hz and the rest uses a frequency of approximately 60 Hz. An auto flicker cancellation (AFC) capability to these two frequencies is mostly operated by using logics. However, in case of using the logics, a number of logics are necessary, thereby causing a big burden on a digital circuit.

SUMMARY OF THE INVENTION

It is, therefore, an object of the present invention to provide a method for integrating an image sensor capable of removing a flicker noise without causing any burdens on a hardware due to setting up additional logics.

In accordance with one aspect of the present invention, there is provided a method for integrating an exposure time of an image sensor employing a line scan method, including the steps of: performing an integration to a first line when an integer multiple of a light source frequency is different from an integration time; and performing an integration to a second line at a phase substantially equal to a phase in which the integration to the first line is started.

In accordance with another aspect of the present invention, there is provided a method for integrating an image sensor using a line type scan, including the steps of: performing an integration to a first line; comparing an integration time with an integer multiple of a frequency of a light source; delaying an integration to a second line until a phase of the second line is substantially identical with a phase of the frequency of the light source started from the integration to the first line as the integer multiple of the frequency of the light source and the integration time are different from each other as a result of the comparison; and performing the integration to the second line in the phase which is substantially identical with the phase of the frequency of the light source started from the integration to the first line.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

A flicker noise phenomenon happens because a frequency of a light source and an integration time of an image sensor are different from each other. A light source is a light generator used in our daily life. Accordingly, the sun is an example of the light source and a fluorescent lamp is also an example of the light source. In case of the sun light, the frequency is fairly high and thus, the integration time is always several thousands times greater than a sun light period. Therefore, the flicker noise is not generated under the sun light. However, in case of the fluorescent lamp, the frequency is approximately 50 Hz or approximately 60 Hz, thereby causing the flicker noise as to an image sensor having an integration time of several tens ms.

A reason why various methods are applied to a CMOS image sensor to remove the flicker noise is because a method for extracting a data from a pixel uses a method for reading one line by one line. Since an identical integration time is applied to each line, if the integration time is different from the frequency of the light source, an amount of energy formed by the light source every each line becomes different from the integration time. Accordingly, the same amount of energy is not inputted and a different amount of energy is inputted, thereby appearing the flicker noise.

The present invention solves this problem of the flicker noise by only using a time control without setting up any additional logics to a hardware.

That is, in accordance with the present invention, during applying the integration method to the image sensor using a line scanning way, in case of an integer multiple of the frequency of the light source is different from the integration time, the integration to a first line is first finished and then, the integration to a second line is performed at the same phase which is practically identical with the phase at which the integration to the first line started.

Figure 1:
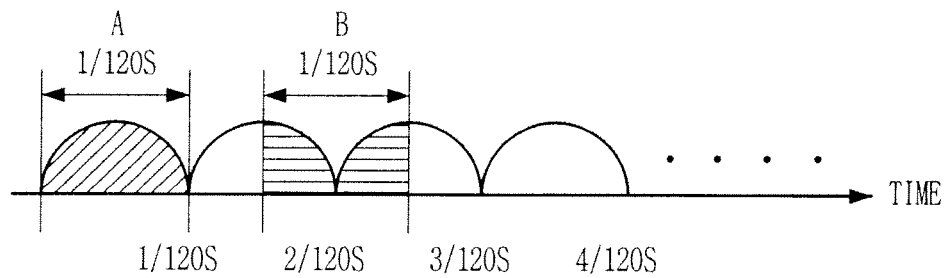
FIG. 1 is a graph briefly illustrating a light energy distribution according to a time when an integration time accords with a frequency of a light source.
Figure 2:
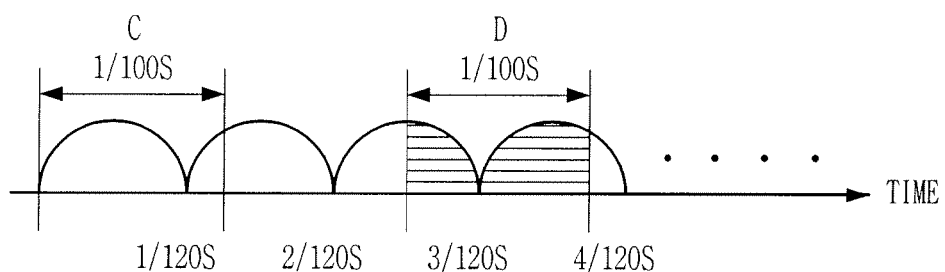
FIG. 2 is a graph briefly illustrating a light energy distribution according to a time when an integration time does not accord with a frequency of a light source.
Figure 3:
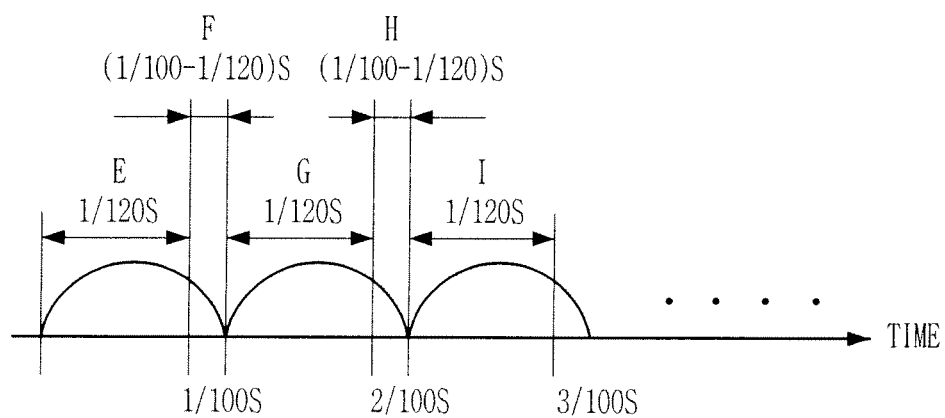
FIG. 3 is a graph illustrating a time control when a frequency of a light source is an integer multiple of approximately 50 Hz and an integration time is 1/(an integer multiple of approximately 60 Hz) in accordance with the present invention.

FIG. 3 is a graph illustrating a time control in case of a frequency of a light source is an integer multiple of approximately 50 Hz and an integration time is 1/(an integer multiple of approximately 60 Hz) in accordance with the present invention.

Referring to FIG. 3, the frequency of the light source is approximately 50 Hz and thus, an energy distribution period of the light source becomes approximately 1/100 seconds. The integration time is approximately 1/120 seconds which is different from approximately 1/100 seconds, an energy distribution period of the light source. A section E representing the integration to the first line shows to perform the integration at a point at which a phase of the light source is approximately 0. After completing the integration to the first line, the integration to the second line is performed at a section G after waiting approximately 1/(an integer multiple of 50) to approximately 1/(an integer multiple of 60), i.e., approximately 1/100 seconds to approximately 1/120 seconds.

By using the same way, the integration is employed at a point of approximately 0 where the phase of the light source in a section G is practically identical with the phase of the light source in a section E. Then, the integration is paused in a section H for approximately 1/100 seconds to approximately 1/120 seconds. Afterwards, the integration is performed again at a point of approximately 0 where the phase of the light source in a section I is practically identical with the phase of the light source in a section E.

As described above, although the frequency of the light source is approximately 50 Hz and the integration time is approximately 60 Hz, it is possible to maintain the light energy almost identically every each line by controlling each phase point of the light source identically with the integration time of each line.

Figure 4:
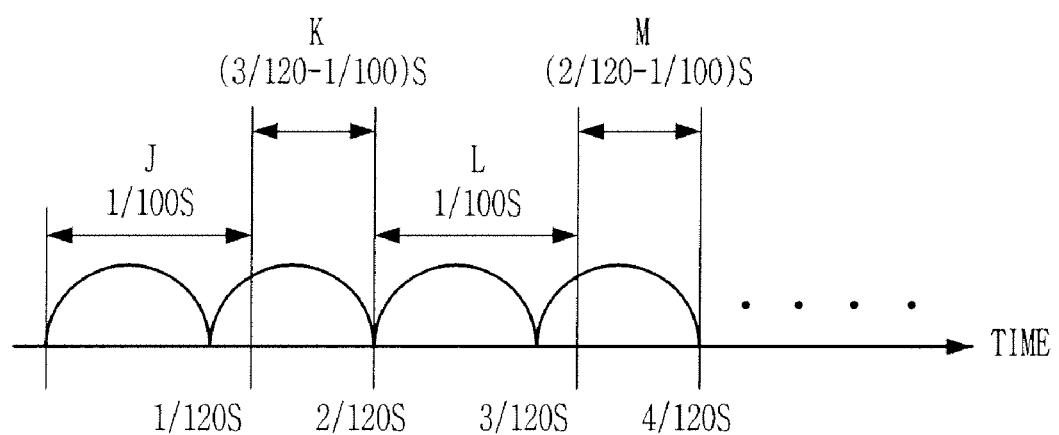
FIG. 4 is a graph illustrating a time control when a frequency of a light source is an integer multiple of approximately 60 Hz and an integration time is 1/(an integer multiple of approximately 50 Hz) in accordance with the present invention.

FIG. 4 is a graph illustrating a time control when a frequency of a light source is an integer multiple of approximately 60 Hz and an integration time is 1/(an integer multiple of approximately 50 Hz).

Referring to FIG. 4, since the frequency of the light source is approximately 60 Hz, the energy distribution period of the light source is approximately 1/120 seconds. The integration time is approximately 1/100 seconds which is different from the energy distribution period of the light source which is approximately 1/120 seconds. A section J representing the integration to the first line shows to perform the integration at a point at which a phase of the light source is approximately 0. After completing the integration to the first line, the integration to the second line is performed at a section L after waiting approximately 2/(an integer multiple of 60) to approximately 1/(an integer multiple of 50), i.e., from approximately 2/120 seconds to approximately 1/100 seconds.

By using the same way, the integration is employed at a point of approximately 0 where the phase of the light source in a section L is practically identical with the phase of the light source in a section G. Then, the integration is paused in a section M for approximately 1/100 seconds to approximately 1/120 seconds. Afterwards, the integration is performed again at a point of approximately 0 where the phase of the light source in a section J is practically identical with the phase of the light source in a section L.

As shown above, although the frequency of the light source is approximately 50 Hz and the integration time is approximately 60 Hz, it is possible to maintain the light energy almost identically every each line by controlling each phase point of the light source identically with the integration time every each line.

Accordingly, in all cases shown in FIGS. 3 and 4, it is possible to remove the flicker noise.

Figure 5:
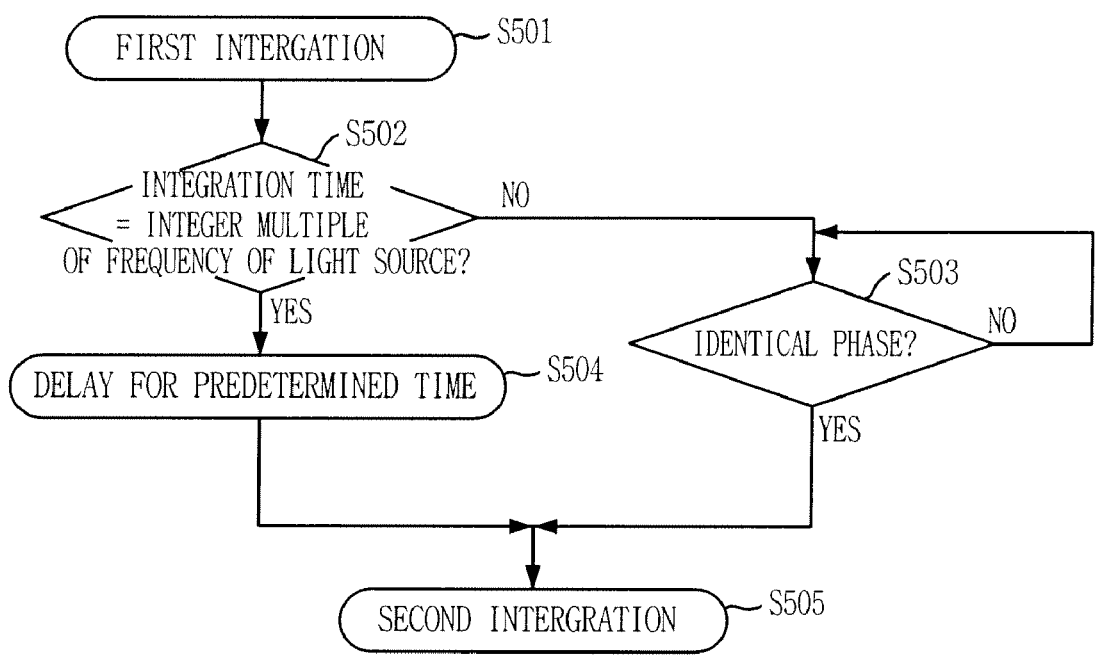
FIG. 5 is a flowchart schematizing an integration method of a line scanning way in accordance with a present invention for removing a flicker noise.

FIG. 5 is a flowchart schematizing an integration method of a line scanning way in accordance with a present invention for removing a flicker noise.

Referring to FIG. 5, an integration method of an image sensor using a line scanning way is examined.

First, an integration is employed to a first line at step S501 and then, an integer multiple of a frequency of a light source is compared with an integration time at step S502.

As a result of comparing the integer multiple of the frequency of the light source with the integration time, as the integer multiple of the frequency of the light source is different from the integration time, the integration to a second line is delayed until a phase becomes substantially identical with the phase of the frequency of the light source started from the integration to the first line. That is, until the integration time of the first line and the integration time of the second line become the same phase, a feedback loop is continuously operated. Afterwards, when becoming the identical phase, the integration to the second line is performed at the substantially identical phase of the frequency of the light source started from the integration to the first line.

Meanwhile, as a result of a step S504, if the integer multiple of the frequency of the light source is identical with the integration time, the integration to the second line is performed after a predetermined delaying time, i.e., approximately 808 clicks. It is a typical way for the line scanning method to perform the integration to a subsequent line after the predetermined delaying time. This delaying time can be variably controlled according to a property of each image sensor and an operating region.

As described above, the present invention makes an auto flicker cancellation (AFC) possible simply by using a time control without causing any burdens on a hardware.

The present invention can remove the flicker noise without causing any burdens on the hardware, thereby improving a price competitiveness.

The present application contains subject matter related to the Korean patent application No. KR 2004-0029015, filed in the Korean Patent Office on Apr. 27, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method comprising:
performing an integration of a first line of an image sensor responsive to a reciprocal of a positive integer multiple of a frequency of a light source being different than an integration time; and
performing an integration of a second line at a phase substantially equal to a phase in which the integration of the first line is started,
wherein when the frequency of the light source is a positive integer multiple of 50 Hz and the integration time is a positive integer multiple of $1/120$ seconds, said performing the integration to the second line is delayed for $1/$(a positive integer multiple of 50) seconds minus $1/$(a positive integer multiple of 60) seconds after completing said performing the integration of the first line.

2. The method of claim 1, wherein when the frequency of the light source is a positive integer multiple of 60 Hz and the integration time is a positive integer multiple of $1/100$ seconds, said performing the integration is delayed for $2/$(an integer multiple of 60) seconds minus $1/$(an integer multiple of 50) seconds after completing said performing the integration of the first line.

3. A method comprising:
integrating a first line of an image sensor, wherein said integrating the first line has a start time corresponding to a first phase of a frequency of a light source;
comparing an integration time with a reciprocal of a positive integer multiple of the frequency of the light source;
if the reciprocal of the positive integer multiple of the frequency of the light source and the integration time are different from each other, delaying a start time for an integration of a second line of the image sensor until a phase of the integration of the second line is substantially identical with the first phase; and
integrating the second line,
wherein said integrating the second line has a start time that is substantially identical to the first phase,
wherein when the frequency of the light source is a positive integer multiple of 50 Hz and the integration time is $1/120$ seconds, the integration to the second line is delayed for $1/$(a positive integer multiple of 50) seconds minus $1/$(a positive integer multiple of 60) seconds after completing the integration of the first line.

4. The method of claim 3, wherein when the frequency of the light source is a positive integer multiple of approximately 60 Hz and the integration time is $1/100$ seconds, the integration to the second line is delayed for $2/$(a positive integer multiple of 60) seconds minus $1/$(a positive integer multiple of 50) seconds after completing the integration of the first line.

5. A method comprising:
performing integration of a first line of an image sensor beginning at a start time corresponding to a first phase of a frequency of a light source; and
performing integration of a second line of the image sensor beginning at a start time corresponding to a second phase of the frequency of the light source;
wherein the first phase and the second phase are substantially identical,
wherein when the frequency of the light source is a positive integer multiple of 50 Hz and the integration time is a positive integer multiple of $1/120$ seconds, a delay of a duration of $1/$(a positive integer multiple of 50) seconds minus $1/$(a positive integer multiple of 60) seconds occurs between completing said performing integration of the first line and starting said performing integration of the second line.

6. The method of claim 5, wherein when the frequency of the light source is 100 Hz and the integration time is $1/120$ seconds, a delay of a duration of $1/100$ seconds minus $1/120$ seconds occurs between completing said performing integration of the first line and starting said performing integration of the second line.

7. The method of claim 5, wherein when the frequency of the light source is a positive integer multiple of 60 Hz and the integration time is a positive integer multiple of $1/100$ seconds, a delay of a duration of $2/$(a positive integer multiple of 60) seconds minus $1/$(a positive integer multiple of 50) seconds occurs between completing said performing integration of the first line and starting said performing integration of the second line.

8. The method of claim 5, wherein when the frequency of the light source is 120 Hz and the integration time is $1/100$ seconds, a delay of a duration of $2/120$ seconds minus $1/100$ seconds occurs between completing said performing integration of the first line and starting said performing integration of the second line.

* * * * *

UNITED STATES PATENT AND TRADEMARK OFFICE
CERTIFICATE OF CORRECTION

| | | |
|---|---|---|
| PATENT NO. | : 8,279,302 B2 | Page 1 of 1 |
| APPLICATION NO. | : 12/419247 | |
| DATED | : October 2, 2012 | |
| INVENTOR(S) | : Han et al. | |

It is certified that error appears in the above-identified patent and that said Letters Patent is hereby corrected as shown below:

On the Face Page, in Field (57), under "ABSTRACT", in Column 2, Line 6, delete "an integer multiple" and insert -- a positive integer multiple --, therefor.

In Column 1, Line 47, delete "an integer" and insert -- a positive integer --, therefor at each occurrence throughout the Specification.

In Column 5, Line 55, in Claim 2, delete "2/(an integer" and insert -- 2/(a positive integer --, therefor.

In Column 5, Line 56, in Claim 2, delete "1/(an integer" and insert -- 1/(a positive integer --, therefor.

Signed and Sealed this
Twenty-sixth Day of March, 2013

Teresa Stanek Rea
*Acting Director of the United States Patent and Trademark Office*